United States Patent [19]
Matsuno

[11] Patent Number: 6,111,461
[45] Date of Patent: Aug. 29, 2000

[54] HIGH FREQUENCY AMPLIFIER CIRCUIT

[75] Inventor: Noriaki Matsuno, Tokyo, Japan

[73] Assignee: NEC Corporation, Tokyo, Japan

[21] Appl. No.: 09/172,145

[22] Filed: Oct. 14, 1998

[30] Foreign Application Priority Data

Oct. 15, 1997 [JP] Japan ................................ 9-280983

[51] Int. Cl.[7] .............................. H03G 5/16; H03G 3/00; H03F 1/26

[52] U.S. Cl. ........................ 330/132; 330/127; 330/149

[58] Field of Search .................................. 330/127, 132, 330/136, 149, 297, 302

[56] References Cited

U.S. PATENT DOCUMENTS

| | | | |
|---|---|---|---|
| 5,164,680 | 11/1992 | Mahabadi | 330/297 |
| 5,272,450 | 12/1993 | Wisherd | 330/297 |

FOREIGN PATENT DOCUMENTS

| | | |
|---|---|---|
| 57-101404 | 6/1982 | Japan . |
| 63-67805 | 3/1988 | Japan . |
| 2-135906 | 5/1990 | Japan . |
| 2-56106 | 5/1990 | Japan . |
| 4-238407 | 8/1992 | Japan . |
| 4-292009 | 10/1992 | Japan . |
| 5-235646 | 9/1993 | Japan . |
| 6-125230 | 5/1994 | Japan . |
| 7-154169 | 6/1995 | Japan . |

OTHER PUBLICATIONS

N. Matsuno et al, "Intermodulation Distortion Dependence on Bias Circuit Design in Power MOSFETs", Proceedings of the 1997 Japanese IEICE Conference, 1997, p. 78.

Primary Examiner—Robert Pascal
Assistant Examiner—Patricia T. Nguyen
Attorney, Agent, or Firm—Sughrue, Mion, Zinn, Macpeak & Seas, PLLC

[57] ABSTRACT

A high frequency amplifier circuit includes the voltage source supplying the power source voltage on the output side of the high frequency amplifying active element. The high frequency amplifier is constructed with a voltage detector detecting a difference frequency voltage of the input signal at a frequency lower than the input signal of the high frequency amplifier circuit and control portion for attenuating the difference frequency voltage from the output signal by controlling the power source voltage on the basis of the difference frequency voltage detected by the voltage detector. Therefore, distortion due to modulating the input signal with the difference frequency component of the input signal can be reduced.

23 Claims, 18 Drawing Sheets

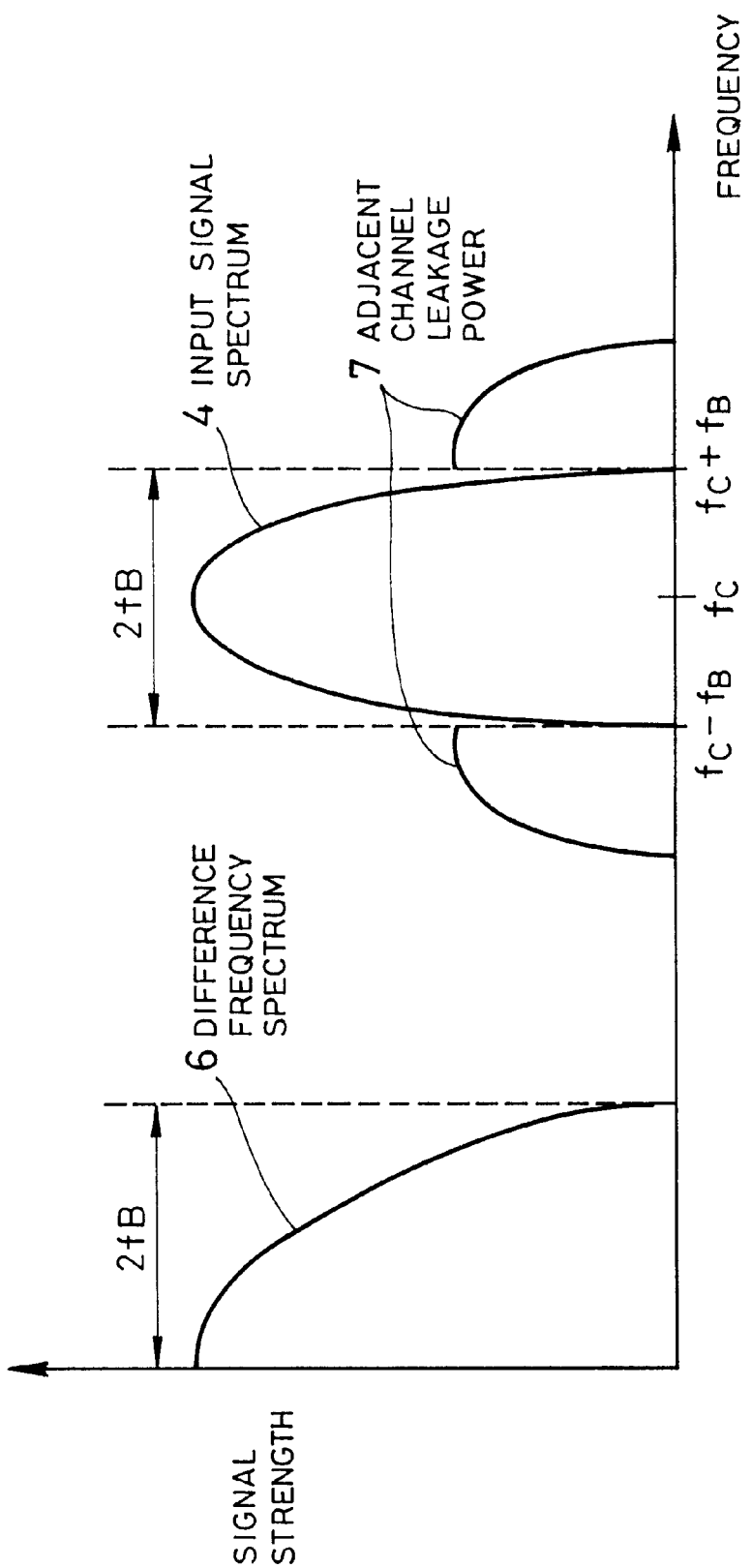

HIGH FREQUENCY AMPLIFIER CIRCUIT

BACKGROUD OF THE INVENTION

1. Field of the Invention

The present invention relates generally to a high frequency amplifier circuit. More particularly, the invention relates to a high frequency amplifier circuit for a cellular phone.

2. Description of the Related Art

One example of the conventional amplifier circuit of 900 MHz band for cellular phone employing a source-grounded MOSFET is illustrated in FIG. 19. On the other hand, a spectrum of an output signal of the amplifier is shown in FIG. 20.

The amplifier circuit is constructed with an input matching circuit 101, a gate bias circuit 102, an amplifying MOSFET (Metal-Oxide Semiconductor Field Effect Transistor) 103, a drain power supply circuit 104, an output matching circuit 105 and an output DC block capacitor 106.

Due to a second order non-linearity of the MOSFET 103, a difference frequency current 2 with a difference frequency of an input signal 1 is generated at a drain terminal of the MOSFET 103.

The difference frequency represents a difference of arbitrary two frequencies within a range of frequency (fc−fB) to (fc+fB) in the case where an input signal is a signal having a band of ±fB centered at a frequency fc, for example.

The difference frequency current 2 does not flow through the output DC blocking capacitor 106 for low frequency, and instead flows to a drain power supply circuit 104.

When the difference frequency current 2 flows to the drain power supply circuit 104, a difference frequency voltage is generated at the drain terminal 3 due to impedance of the drain power supply circuit 104.

A difference frequency spectrum shown in FIG. 20 corresponds to the difference frequency voltage and an input signal spectrum 4 corresponds to a voltage of a signal to be amplified. By modulating the input signal 1 with the difference frequency signal, a distortion output is generated in a frequency band in the vicinity of the input signal 1. As a result, an adjacent channel leakage power 7 is generated as shown in FIG. 20.

For restricting occurrence of strain in such mechanism, it is effective to lower an impedance of the drain power supply circuit 104 with respect to the difference frequency for shorting the difference frequency.

As a publication to be made reference to with respect to the distortion generating mechanism, 1996 General Conference of The institute of Electronics, Information and Communication Engineer, Lecture No. C-2-23, "Influence of Power Source Circuit in Mutual Modulation Distortion Characteristics of Power MOSFET" (Matsuno, et al.) may be made reference to.

However, to the drain power supply circuit 104, it is required to set high an impedance in the band of the input signal 1.

Particularly, when a modulation signal having wide band width is to be handled, since difference frequency becomes high, a difficulty is encountered in simultaneously optimizing two conditions that the impedance with respect to the difference frequency is low, and the impedance at the band of the input signal 1 is high.

Another example of the prior art has been disclosed in Japanese Unexamined Patent Publication No. Heisei 5-235646. In the disclosed prior art, distortion of the amplifier is reduced by providing a distortion compensator having inverted distortion characteristics at a preceding stage of the amplifier containing distortion.

However, what can be compensated by the prior art is only distortion for generated by the odd-order non-linearity of the amplifier.

The distortion generated by modulating the input signal with the difference frequency component of the input signal which is generated by the second order non-linearity of the amplifier cannot be lowered.

Then, the distortion has been reporting in 1997 General Conference of The institute of Electronics, Information and Communication Engineer, Lecture No. C-2-23, "Influence of Power Source Circuit in Mutual Modulation Distortion Characteristics of Power MOSFET" (Matsuno, et al.).

A further example of the prior arts have been disclosed in Japanese Unexamined Patent Publication No. Heisei 7-154169 and Japanese Unexamined Patent Publication No. Heisei 6-125230. In these prior art, depending upon an amplitude of an input signal of the amplifier, a power source voltage input to the amplifier is varied to lower distortion with maintaining efficiency of the amplifier high.

However, these prior art only controls the output amplitude in linear operation of the amplifier depending upon amplification of the input signal of the amplifier, and cannot reduce distortion to be generated by modulation of the input signal by the difference frequency component of the input signal caused due to the second order non-linearity of the amplifier.

SUMMARY OF THE INVENTION

Therefore, an object of the present invention is to provide with high frequency amplifier circuit which can lower distortion generated by modulation of the input signal by a difference frequency component of the input signal.

In accordance with the present invention, a high frequency amplifier circuit including a voltage supply means for supplying a power source voltage to an output side of a high frequency amplifying active element, comprises:

signal detecting means for detecting a difference frequency signal of an input signal at a frequency lower than the input signal of the high frequency amplifier circuit; and signal attenuation means for attenuating the difference frequency signal from an output signal by controlling a power source voltage on the basis of the difference frequency signal detected by the signal detecting means.

With the present invention set forth above, on the basis of the difference frequency signal detected by the signal detecting means, the signal attenuation means adjusts the power source voltage for canceling the difference frequency signal.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings:

FIG. 20 is an explanatory illustration of an output signal spectrum of the conventional amplifier.

DESCRPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
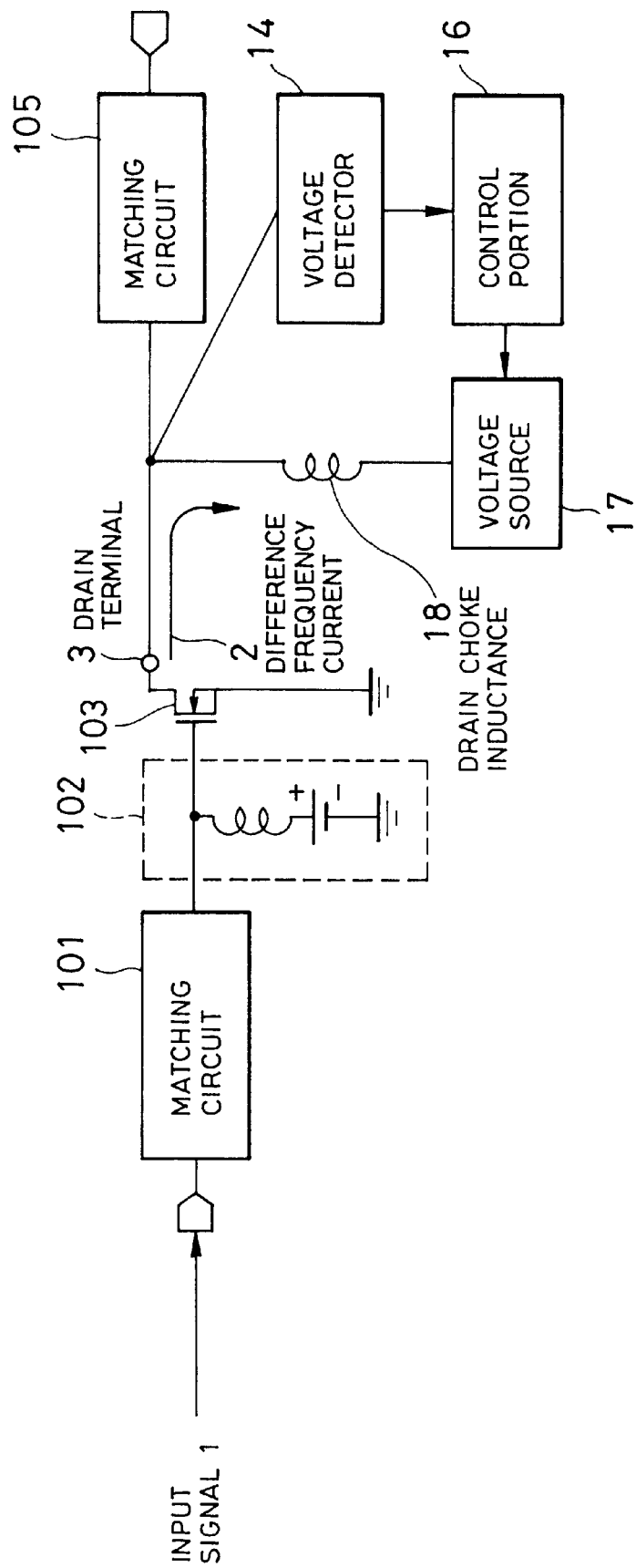
FIG. 1 is a block diagram showing a construction of the preferred embodiment of a high frequency amplifier circuit according to the present invention.

FIG. 1 is a block diagram showing a construction of the first embodiment of a high frequency amplifier circuit according to the present invention, which constitutes the best mode of the present invention.

A high frequency amplifier circuit includes an input matching circuit 101, a gate bias circuit 102, a high frequency amplifying MOSFET 103, a drain choke inductance 18, a voltage source 17 supplying a drain power source of the MOSFET 103, a voltage detector 14 detecting a voltage at a drain, a control portion 16 controlling a voltage of the voltage source 17 depending upon a voltage detected by the voltage detector 14.

The drain choke inductance 18 is a sufficiently high inductance with respect to a signal which is amplified (a signal corresponding to an input signal spectrum 4, see FIG. 20). The inductance represents low impedance with respect to a signal having a frequency lower than a signal to be amplified as a difference frequency (a signal corresponding to a difference frequency spectrum 6, see FIG. 20).

It should be noted that the voltage detector 14 is a conventional detector which can detect the voltage having relative low frequency, namely a voltage corresponding to the difference frequency spectrum of the present invention. Accordingly, a voltage corresponding to the input signal spectrum 4 far higher than the difference frequency 6 cannot be detected.

On the other hand, a low-pass filter may be inserted for inputting an only voltage corresponding to the difference frequency spectrum 6 on an input side of the voltage detector 14.

On the other hand, the voltage output from the voltage detector 14 is an instantaneous value instead of an effective value. Accordingly, the control portion 16 controls a voltage of the voltage source 17 depending upon a voltage of the instantaneous value.

Next, operation will be discussed.

When a signal 1 is input to a gate of the MOSFET 103, due to the second order non-linearity of the MOSFET 103, a difference frequency current 2 with a difference frequency of the input signal 1 is generated at a drain terminal 3 of the MOSFET 103. Since the difference frequency current 2 has low frequency, the difference frequency current 2 flows into the voltage source 17 of the drain via the drain choke inductance 18.

Figure 19:
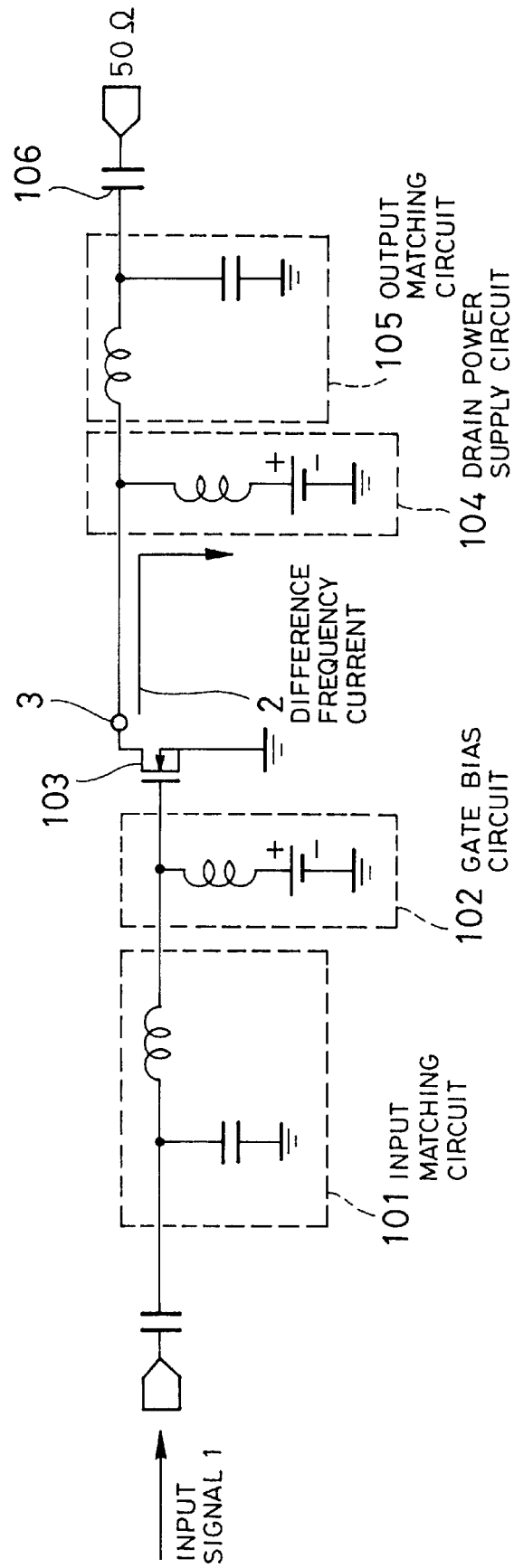
FIG. 19 is a block diagram showing a construction of one example of the conventional 900 MHz band amplifier circuit for a cellular phone employing a source-grounded MOSFET.

At this time, in the amplifier circuit employing the prior art, the difference frequency voltage is generated by the impedance of the power source supply circuit 104 (see FIG. 19). The difference frequency voltage causes fluctuation of the voltage at the drain terminal 3 to cause distortion by modulation of the input signal 1 from the gate.

In contrast to this, in the preferred embodiment of the present invention, a voltage of the difference frequency at the drain terminal 3 is detected by the voltage detecting portion 14 to control a voltage generated by the power source 17 by the control portion 16 so that the voltage of the difference frequency becomes zero.

Namely, the control portion 16 generates the voltage having different phase over 180° with respect to the difference frequency voltage to cancel only difference frequency voltage component among the power source voltage.

It should be noted that while the voltage corresponding to the input signal spectrum is also generated together with the difference frequency voltage, the conventional voltage detector can not detect the input signal since the frequency of the input signal spectrum is much higher than the difference frequency, therefore, an influence of the voltage different in the phase of 180° relative to the difference frequency voltage generated from the voltage source 17 would hardly occur to the frequency of the input signal spectrum.

By this, since the difference voltage is not generated at the drain terminal 3, distortion to be generated by modulation of the input signal 1 by the difference frequency voltage of the input signal 1 can be restricted.

Next, embodiments of the present invention will be discussed. At first, the first embodiment will be discussed with reference to FIG. 1.

The input signal 1 is a signal having a band width of 1.23 MHz centered at a frequency of 950 MHz. The voltage of the drain terminal 3 is detected by the voltage detector 14 to input the detected data to the control portion 16. The control portion 16 controls a voltage to be generated by a voltage source 17 so that the difference frequency voltage of the input signal 1 generated at the drain terminal 3, in the shown case, the voltage less than or equal to 1.23 MHz, namely an integer multiple of the difference frequency voltage and the difference frequency and the voltage of the frequency component of less than or equal to 1.23 MHz, becomes zero.

By this, the difference frequency voltage of the input signal 1 generated at the drain terminal 3 can be restricted. Thus, distortion can be reduced irrespective of the impedance of the drain power supply circuit.

Figure 2:
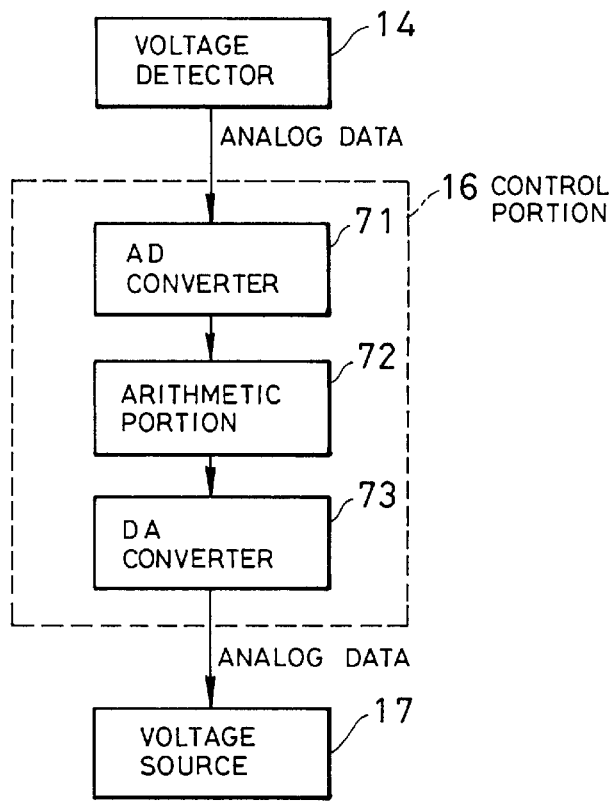
FIG. 2 is a block diagram showing the first embodiment of a control portion in the high frequency amplifier circuit according to the invention.
Figure 3:
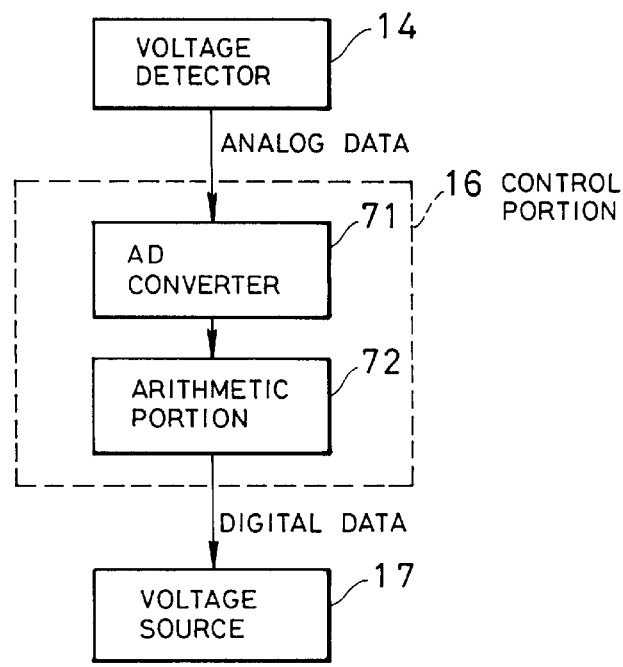
FIG. 3 is a block diagram showing the second embodiment of a control portion in the high frequency amplifier circuit according to the invention.
Figure 4:
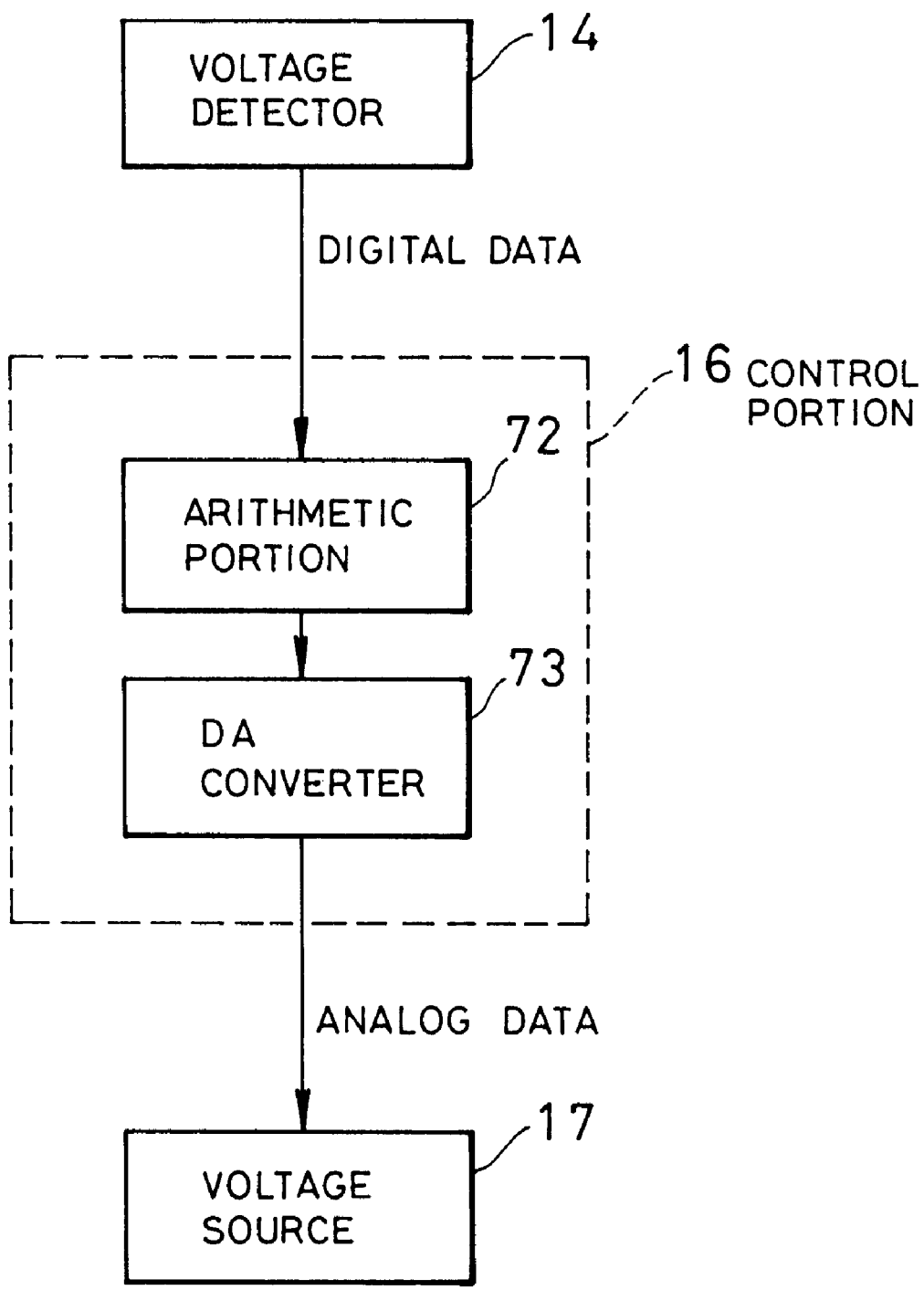
FIG. 4 is a block diagram showing the third embodiment of a control portion in the high frequency amplifier circuit according to the invention.

Next, the embodiments of the control portion 16 will be discussed. FIGS. 2 to 4 are block diagrams of the first to third embodiments of the control portion 16. It should be noted that, for convenience in FIGS. 2 to 4, the voltage detector 14 and the voltage source 17 are illustrated.

At first, the first embodiment of the control portion 16 will be discussed with reference to FIG. 2. The control portion 16 comprises an AD converter 71 performing digital conversion of an analog data, an arithmetic portion 17 performing arithmetic operation of the data output from the AD converter 72 and a DA converter 73 converting the result of arithmetic operation into the analog data.

Next, operation will be discussed. The analog data of the instantaneous value of the voltage output from the voltage detector 14 is converted into the digital data by the AD converter 71. Also, in the arithmetic portion 72, the control signal is determined. The control signal after determination is converted into the analog data again by the DA converter 73, and thereafter, is input to the voltage source 17. The voltage source 17 is controlled by the analog data.

Next, the second embodiment of the control portion will be discussed with reference to FIG. 3. The control portion 16 comprises the AD converter 71 performing digital conversion of the analog data and the arithmetic portion 72 performing arithmetic operation of the data output from the AD converter 71.

Next, operation will be discussed. The analog data of the instantaneous value of the voltage output from the voltage detector 14 is converted into the digital data by the AD converter 71. Then, the control signal is determined by the arithmetic portion 72. The control signal after determination is input to the voltage source 17 in a form of the digital data. The voltage source 17 is controlled by the digital data.

Next, the third embodiment of the control portion will be discussed with reference to FIG. 4, the control portion 16 comprises the arithmetic portion 72 performing arithmetic operation of the digital data output from the voltage detector 14 and the DA converter 73 converting the result of arithmetic operation in the arithmetic portion 72.

Next, operation will be discussed. The digital data of the instantaneous value of the voltage output from the voltage detector 14 is input to the arithmetic portion 72. Then, the control signal is determined. The control signal thus determined is converted into the analog signal by the DA converter 73. Thereafter, the analog control signal is input to the voltage source 17 to control the voltage source 17 by the analog data.

Figure 5:
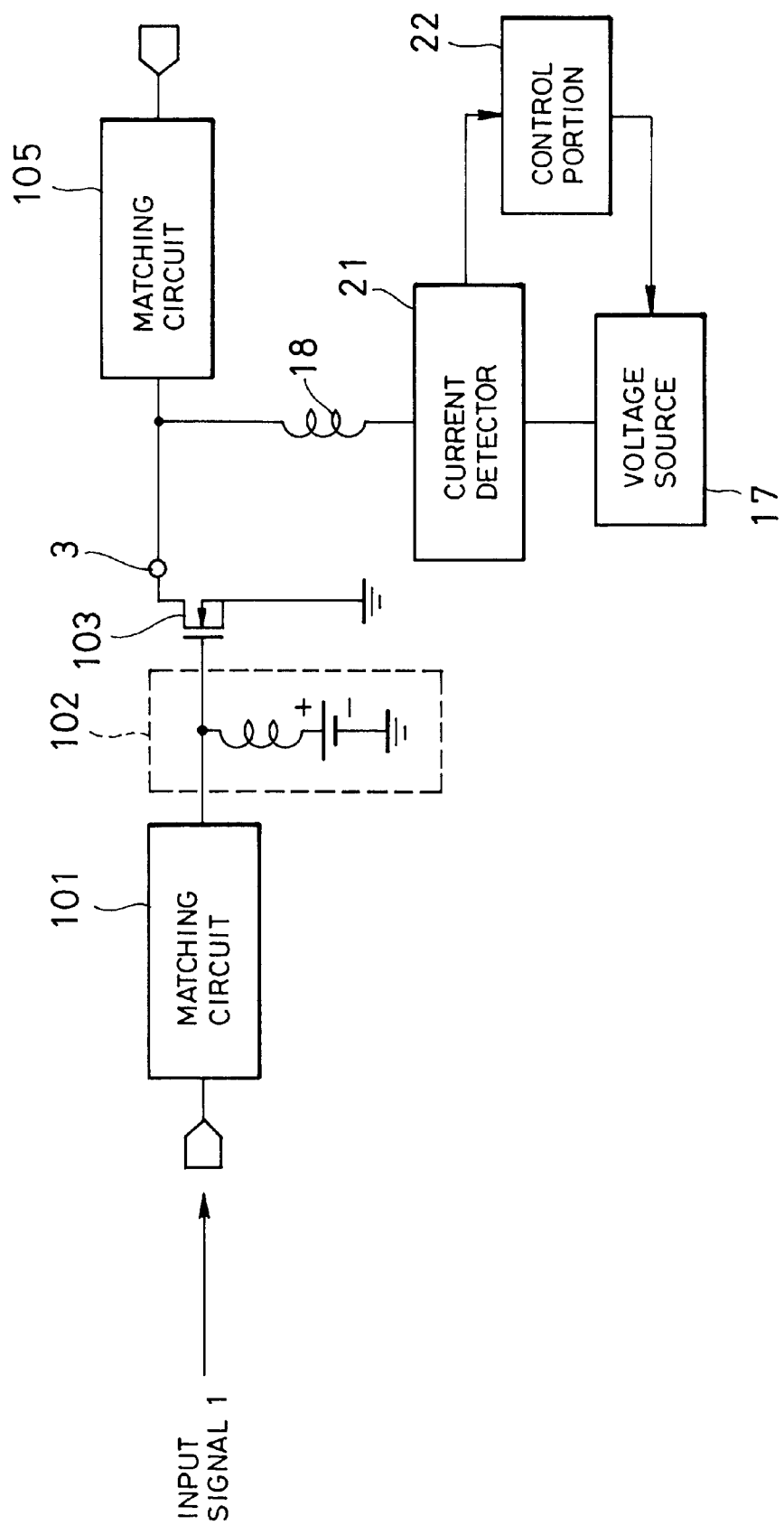
FIG. 5 is a block diagram showing a construction of the second embodiment of a high frequency amplifier circuit according to the present invention.

Next, the second embodiment of the high frequency amplifier circuit according to the present invention will be discussed with reference to FIG. 5. FIG. 5 is a block diagram of the second embodiment of the high frequency amplifier circuit according to the present invention, It should be noted that the like portions to those in FIG. 1 will be represented by like reference numerals to avoid necessity of redundant discussion to maintain the disclosure simple enough for facilitating clear understanding of the present invention.

The second embodiment of the high frequency amplifier circuit comprises the input matching circuit 101, the gate bias circuit 102, the high frequency amplifying MOSFET 103, the drain choke inductance 18, a current detector 21 for detecting a drain current, the voltage source 17 for supplying a power source to the drain of the MOSFET 103, a control portion controlling the voltage of the voltage source 17 depending upon a current detected by the current detector 21, and the output matching circuit 105.

Next, operation will be discussed.

A current flowing through the drain power source supply circuit is detected by the current detector 21. The detected data is input to the control portion 22. The control portion 22 predicts a difference frequency voltage component of the input signal 1 generated at the drain terminal 3 from the current flowing through the drain power supply circuit.

A method for predicting the difference frequency voltage component from the current input to the current detector 21 is similar to the method for detecting the difference frequency voltage component from the output voltage set forth above.

Namely, the current detector 21 is a typical current detector which can detect a current of a signal having relative low frequency, such as the difference frequency. By the current detector 21, only a direct current voltage of the power source and difference frequency current are detected, and a current corresponding to the input signal spectrum 4 is not detected.

The control portion 22 separates the difference frequency current from the direct current voltage and predicts the difference frequency voltage from the difference frequency current.

Then, the control portion 22 controls the voltage generated in the voltage source 17 so that the difference frequency voltage component becomes zero.

By this, since the difference frequency voltage of the input signal 1 generated at the drain terminal 3 is restricted, distortion can be reduced irrespective of the impedance of the drain power source supply circuit. Accordingly, in the present invention, the drain choke inductance 18 is required to have sufficiently high impedance for the input signal to be amplified. Thus, it becomes possible to avoid trade off f the impedance with respect to the amplifying signal band and the difference frequency band.

Figure 6:
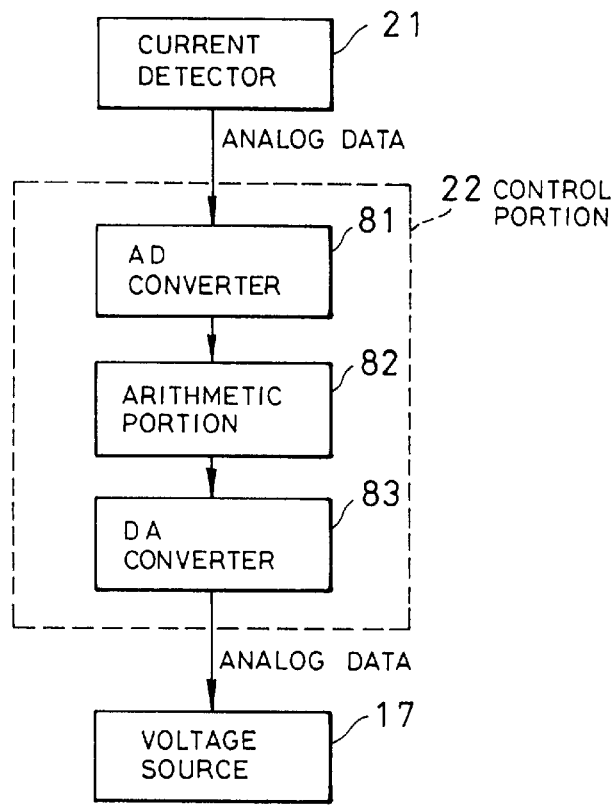
FIG. 6 is a block diagram showing the fourth embodiment of a control portion in the high frequency amplifier circuit according to the invention.
Figure 7:
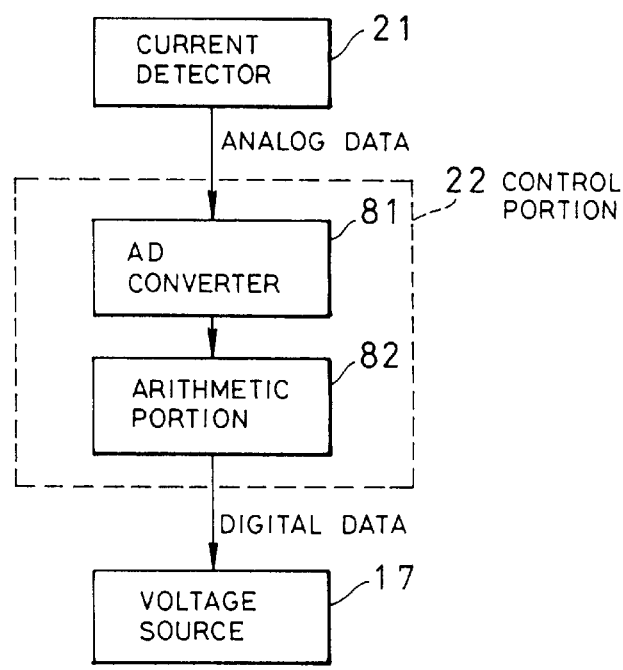
FIG. 7 is a block diagram showing the fifth embodiment of a control portion in the high frequency amplifier circuit according to the invention.
Figure 8:
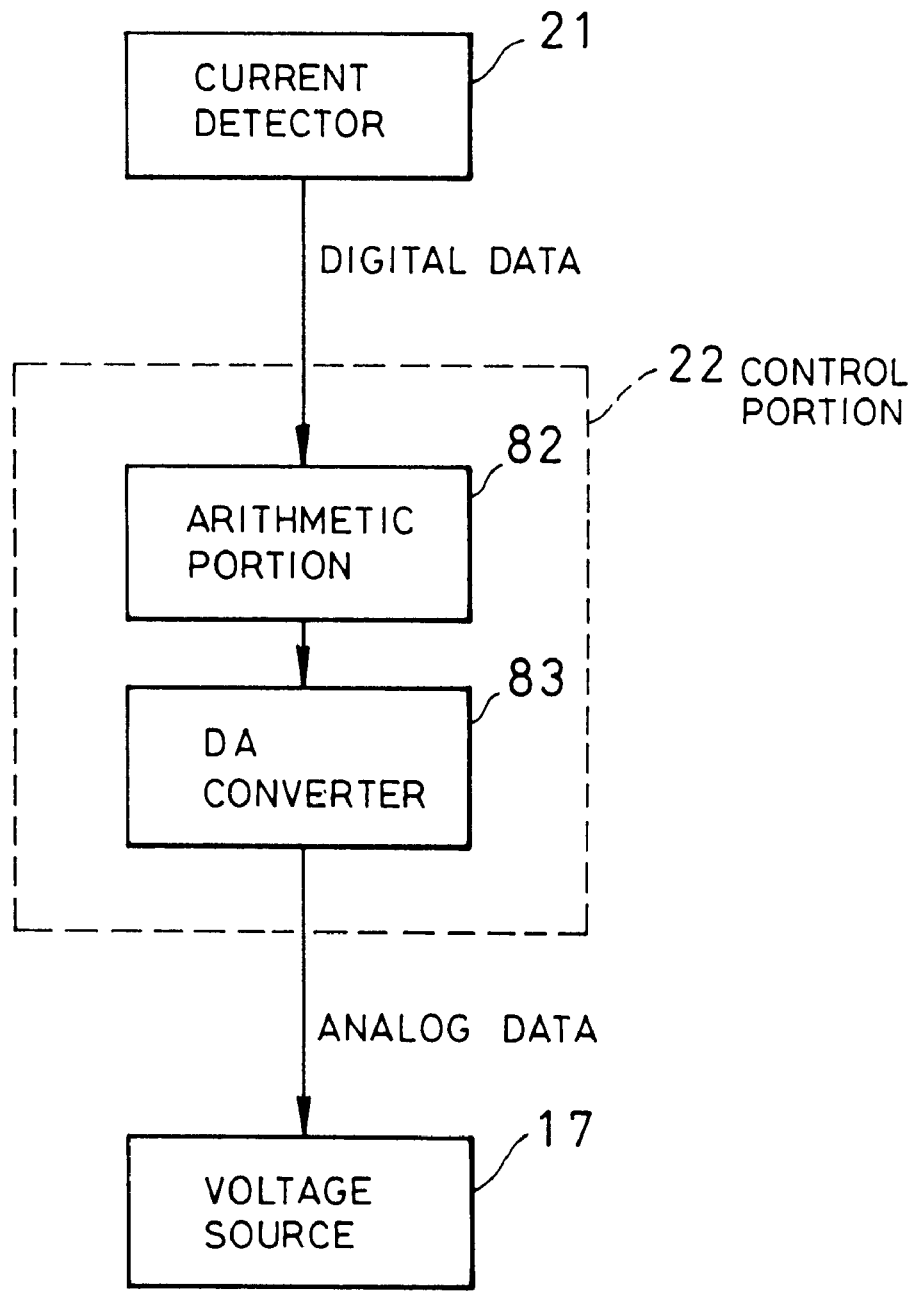
FIG. 8 is a block diagram showing the sixth embodiment of a control portion in the high frequency amplifier circuit according to the invention.

Next, embodiments of the control portion 22 will be discussed. FIGS. 6 to 8 are block diagrams showing a construction of the fourth to sixth embodiment of the control portion. It should be noted that, for convenience, the current detector 21 and the voltage source 17 are illustrated in FIGS. 6 to 8.

At first, the fourth embodiment of the control portion will be discussed with reference to FIG. 6. The control portion 22 comprises an AD converter 81 digital converting the analog signal, an arithmetic portion 82 performing arithmetic operation for the data output from the AD converter 81 and a DA converter 83 converting the result of arithmetic operation in the arithmetic portion 82 into an analog data.

Next, operation will be discussed. An analog data of the instantaneous value of the current output from the current detector 21 is converted into the digital data by the AD converter 81. Then, the control signal is determined in the arithmetic portion 82. After determination, the control signal is converted into the analog data again by the DA converter 83 to be input to the voltage source 17. The voltage source 17 is controlled by the analog data.

Next, the fifth embodiment of the control portion will be discussed with reference to FIG. 7. The control portion 22 comprises the AD converter 81 digital converting the analog data and the arithmetic portion 82 performing arithmetic operation of the data output from the AD converter 81.

Next, operation will be discussed. The analog data of the instantaneous value of the current output from the current detector 21 is converted into the digital data by the AD converter 81. Then, the control signal is determined by the arithmetic portion 82. After determination, the control signal is input to the voltage source 17 in a form of the digital data. The voltage source 17 is controlled by the digital data.

Next, the sixth embodiment of the control portion will be discussed with reference to FIG. 8. The control portion 22 comprises the arithmetic portion 82 performing arithmetic operation of the digital data output from the current detecting portion 21, and the DA converter 83 converting the result of arithmetic operation of the arithmetic portion 82 into the analog data.

Next, operation will be discussed. The digital data of the instantaneous value of the current output from the current detector 21 is input to the arithmetic portion 82. Then, in the arithmetic portion 82, the control signal is determined. After determination, the control signal is converted into the analog signal by the DA converter 83 and then input to the voltage source 17. Thus, the voltage source 17 is controlled by the analog data.

Figure 9:
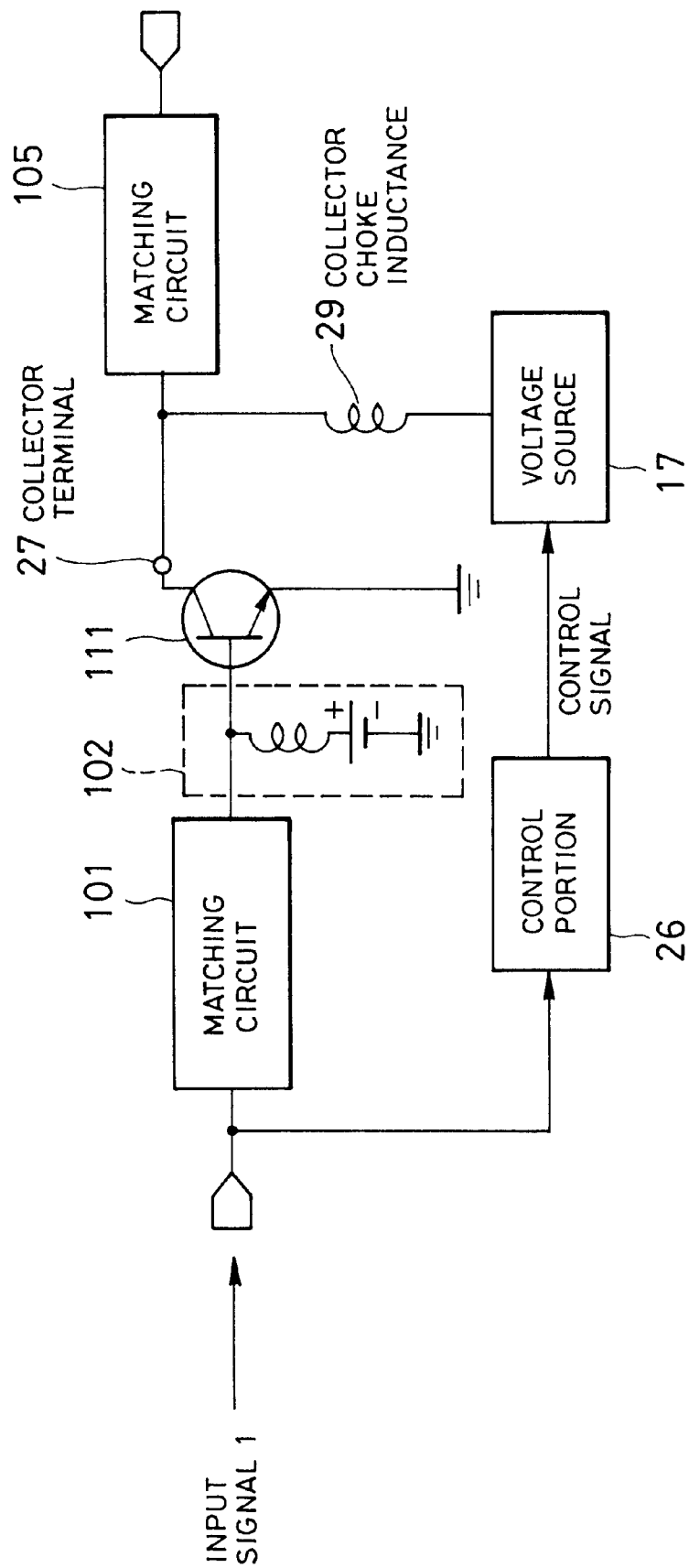
FIG. 9 is a block diagram showing a construction of the third embodiment of a high frequency amplifier circuit according to the present invention.

Next, the third embodiment of the present invention will be discussed with reference to FIG. 9. FIG. 9 is a block diagram showing a construction of the third embodiment of the high frequency amplifier circuit according to the present invention. It should be noted that like portions to those of FIG. 1 will be represented by like reference numerals to avoid necessity of redundant discussion to maintain the disclosure simple enough for facilitating clear understanding of the present invention.

The third embodiment of the high frequency amplifier circuit according to the present invention includes the input matching circuit 101, the gate bias circuit 102, a high frequency amplifying bipolar transistor 111, a collector choke inductance 29, the voltage source 17 for supplying a power source to a collector of the bipolar transistor 111, a control portion 26 controlling the output voltage of the voltage source 17 on the basis of the input signal 1, and the output matching circuit 105.

Next, operation will be discussed.

To the control portion 26, the input signal 1 is input to predict a difference frequency component of the input signal 1 generated at a collector terminal 27. The prediction is performed by calculating a difference signal of arbitrary two frequencies in the frequency band of the input signal 1 set forth above.

The control portion 26 predicts the difference frequency voltage component and controls the voltage source 17 for canceling the difference frequency voltage component.

By this, the difference frequency voltage of the input signal 1 generated at the collector terminal 27 is restricted. Thus, distortion can be reduced irrespective of the impedance of the drain power supply circuit. Accordingly, in the present invention, the collector choke inductance 29 is required to have sufficiently high impedance for the input signal to be amplified. A trade off of the impedance for the amplifying signal band and the difference frequency band as required in the prior art.

Figure 10:
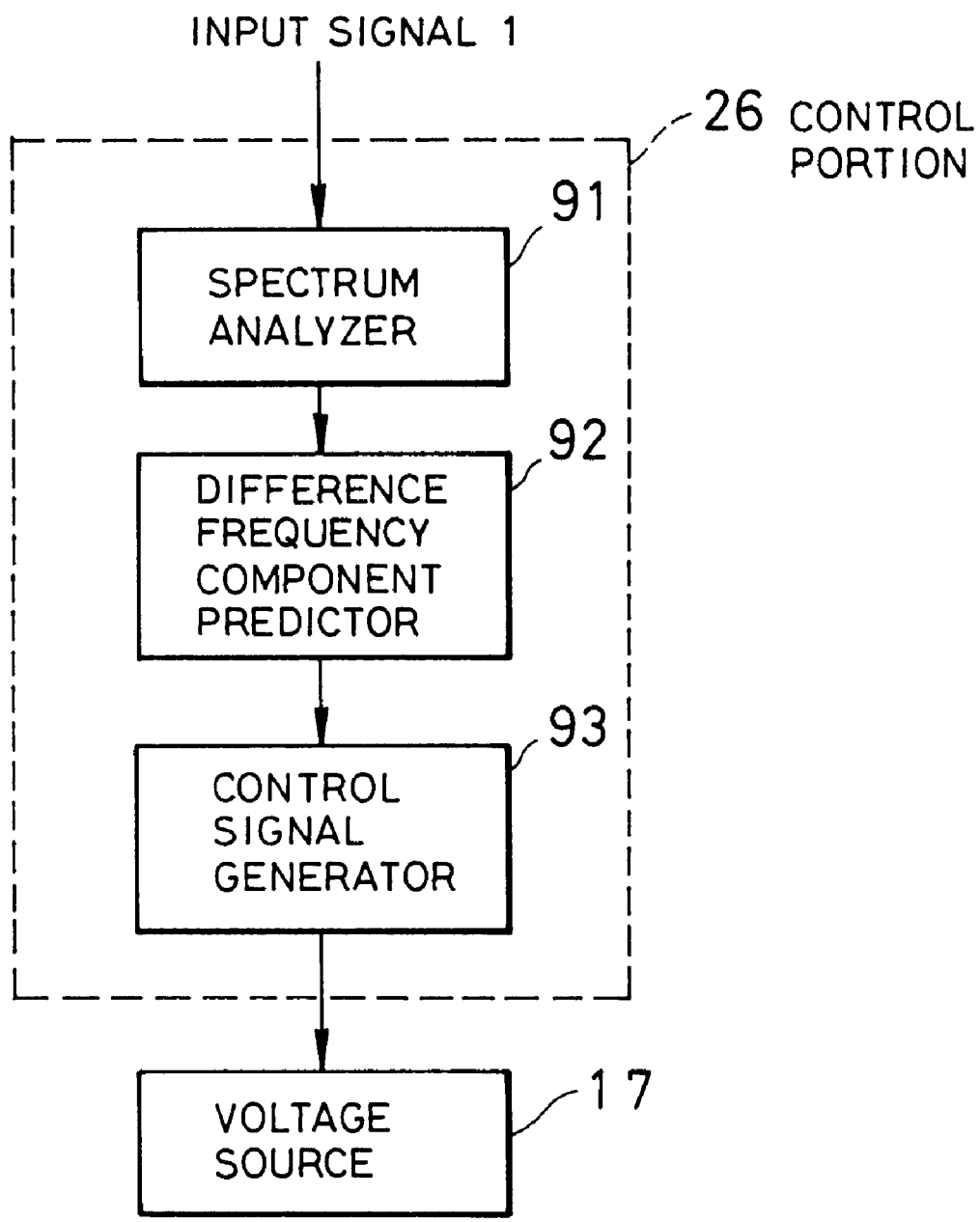
FIG. 10 is a block diagram showing the seventh embodiment of a control portion in the high frequency amplifier circuit according to the invention.
Figure 11:
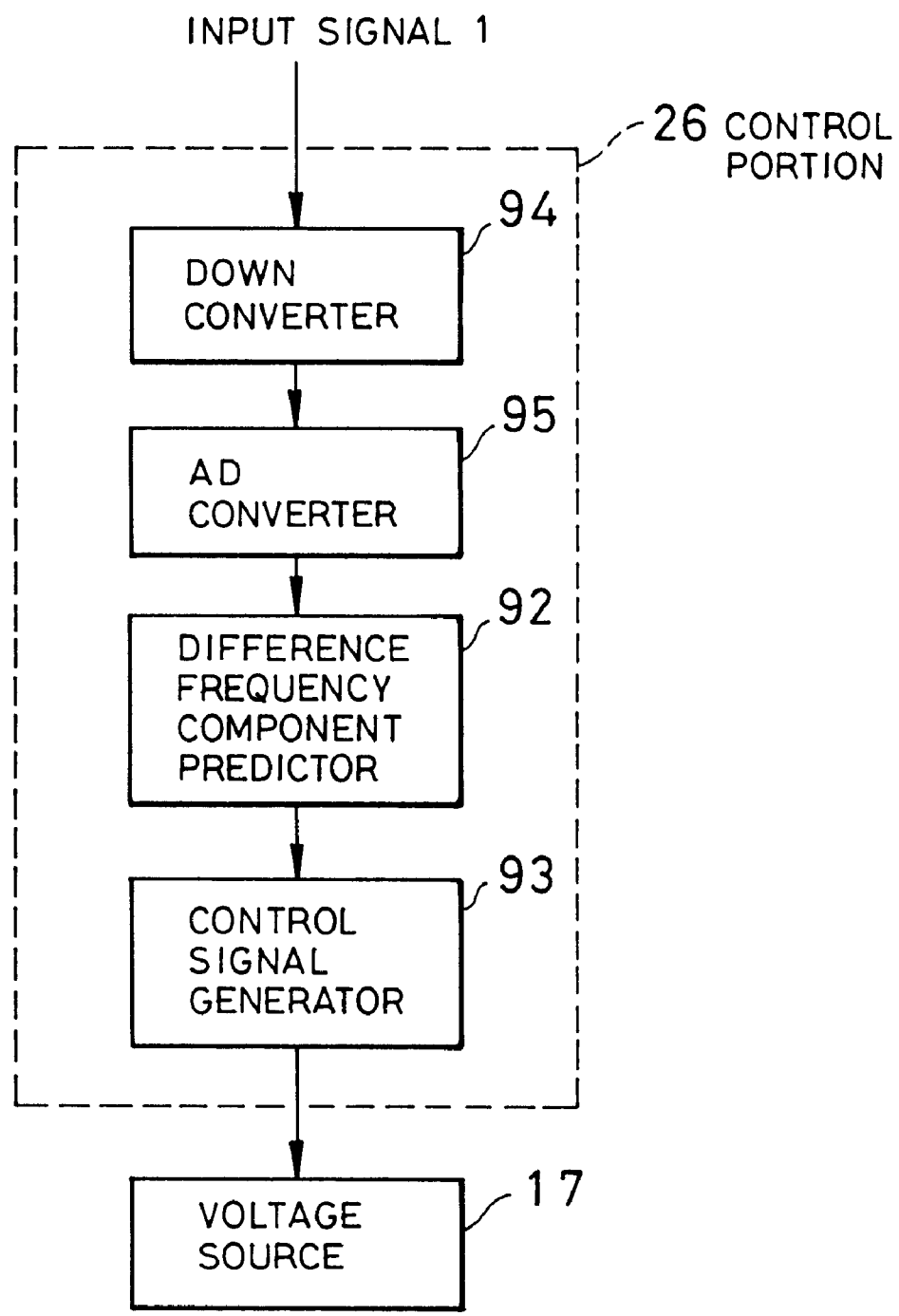
FIG. 11 is a block diagram showing the eighth embodiment of a control portion in the high frequency amplifier circuit according to the invention.
Figure 12:
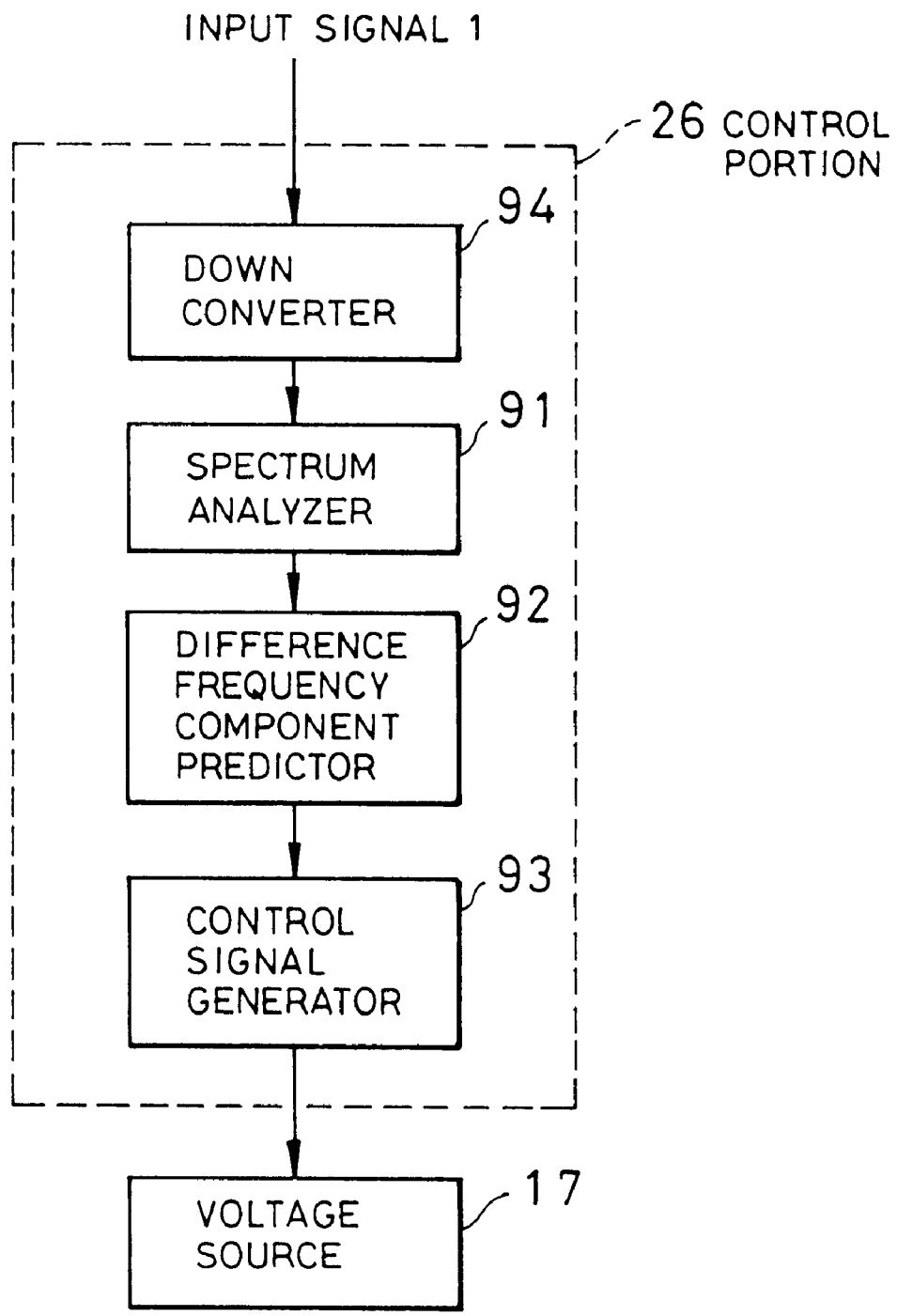
FIG. 12 is a block diagram showing the ninth embodiment of a control portion in the high frequency amplifier circuit according to the invention.

Next, discussion will be given for the embodiments of the control portion 26. FIGS. 10 to 12 are block diagrams of the seventh to ninth embodiments of the control portion. It should be noted that for convenience, the voltage source 17 is also illustrated.

At first, the seventh embodiment of the control portion will be discussed with reference to FIG. 10. The control portion 26 comprises a spectrum analyzer 91 analyzing a spectrum of the input signal 1, a difference frequency component predictor 92 for predicting a difference frequency component from the spectrum analyzed by the spectrum analyzer 91 and a control signal generator 93 generating a control signal on the basis of the difference frequency component predicted by the difference frequency component predictor 92.

Next, operation will be discussed. The spectrum of the input signal 1 is analyzed by the spectrum analyzer 91. Then, on the basis of the result of analysis, the difference frequency component predictor 92 predicts the difference frequency component. The control signal generator 93 controls the voltage source 17 on the basis of the difference frequency component predicted by the difference frequency component predictor 92.

The eighth embodiment of the control portion will be discussed with reference to FIG. 11. The eighth embodiment is illustrated in terms that a signal which is generated by modulating a carrier wave with a base band signal is used as the input signal 1.

The control portion 26 comprises a down converter 94 dropping the input signal to the base band, an AD converter 95, the difference frequency component predictor 92 and the control signal generator 93.

Next, operation will be discussed. The input signal 1 is dropped to the base band by the down converter 94. The base band signal is sampled by the AD converter 95. On the basis of the result of sampling, the difference frequency component predictor 92 predicts the difference frequency. On the basis of the result of prediction, the control signal generator 93 generates the control signal. By the control signal, the output voltage of the voltage source 17 can be controlled.

It should be noted that once a string of the signal of the base band is determined, the waveform of the input signal can be predicted on the basis of the string. When the waveform of the input signal can be predicted, the difference frequency signal can be predicted as set forth above.

Next, the ninth embodiment of the control portion will be discussed with reference to FIG. 12. The ninth embodiment also illustrates the case where a signal which is generated by modulating a carrier wave with a base band signal is used as the input signal 1.

The control portion 26 comprises the down converter 94 dropping the input signal 1 to the base band, the spectrum analyzer 91, the difference frequency predictor 92 and the control signal generator 93.

Next, operation will be discussed, the input signal 1 is dropped to the base band by the down converter 94. The base band signal is then analyzed by spectrum analysis by the spectrum analyzer 91. On the basis of the result of spectrum analysis, the difference frequency component predictor 92 predicts the difference frequency spectrum. On the basis of the result of prediction, the control signal generator 93 generates the control signal. By this control signal, the output voltage of the voltage source 17 is controlled.

Figure 13:
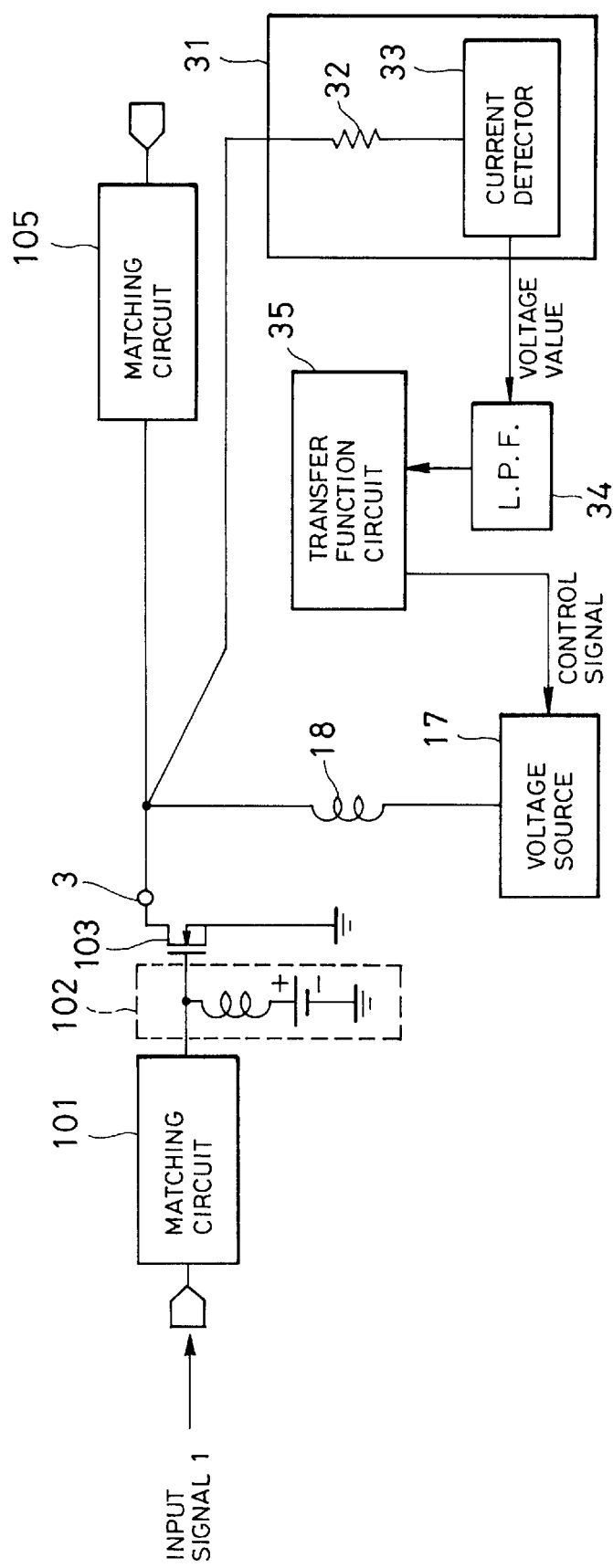
FIG. 13 is a block diagram showing a construction of the fourth embodiment of a high frequency amplifier circuit according to the present invention.

Next, the fourth embodiment of the present invention will be discussed with reference to FIG. 13. FIG. 13 is a block diagram showing a construction of the high frequency amplifier circuit according to the present invention. It should be noted that the like portions to those in FIG. 1 will be represented by like reference numerals to avoid necessity of redundant discussion to maintain the disclosure simple enough for facilitating clear understanding of the present invention.

The fourth embodiment of the high frequency amplifier circuit according to the present invention comprises the matching circuit 101, the gate bias circuit 102, the high frequency amplifying MOSFET 103, the drain choke inductance 18, the voltage source 17 supplying the power to the drain of the MOSFET 103, a voltage detector 31 constructed with a high resistance resistor 32 and a current detector 33, a low-pass filter (L.P.F.) 34, a transfer function circuit 35, and the matching circuit 105.

The voltage detector 31 detects the voltage by detecting a fine current flowing through the high resistance resistor 32 by the current detector 33. The detected voltage value is input only difference frequency of the input signal and the frequency component of integer multiple of the difference frequency to the transfer function circuit 35 through the low-pass filter 34. Through the transfer function circuit 35, a signal made up the frequency characteristics of the intensity and phase controls the output voltage of the voltage controlled voltage source 17.

At this time, the frequency characteristics of the transfer function circuit 35 is selected that the difference frequency of the input signal 1 and the voltage having frequency of integer multiple of the difference frequency at the drain terminal 3 become zero.

Namely, the frequency characteristics of the transfer function circuit 35 is that derived by converting the difference frequency voltage and the voltage having frequency of integer multiple of the difference frequency into the voltage different for 180° phase.

Next, the operation of the transfer function circuit 35 is supplemented. The output of the transfer function circuit 35 is an analog voltage signal. The current detector 33 generates a voltage signal proportional to the voltage of the drain terminal 3. By passing the voltage signal to the low-pass filter 34, the voltage signal proportional to the component of low frequency including the difference frequency voltage among the voltage of the drain terminal 3 can be obtained.

When this voltage signal is input to the voltage source 17 as is, it is expected that the difference frequency voltage at the drain terminal 3 would not become zero due to influence of the choke inductance 18. In order to avoid the influence of the chock inductance 18, intensity and phase of the control voltage signal is adjusted through the transfer function circuit 35.

The transfer function circuit 35 is an analog circuit, in which some of LRC filter circuits and amplifiers are combined. In the alternative, the transfer function circuit 35 is a circuit converting the signal from the low-pass filter 34 into the digital data by the AD converter and after passing a digital filter, obtaining an analog output by the DA converter.

By this, since the difference frequency voltage of the input signal 1 generated at the drain terminal 3 is restricted, distortion can be reduced irrespective of the impedance of the drain power supply circuit. Accordingly, in the present invention, the drain choke inductance 18 is merely require to have sufficiently high impedance for the input signal to be amplified. Thus trade off of the impedance of the amplifying signal band and the difference frequency band as that required in the prior art can be resolved.

Figure 14:
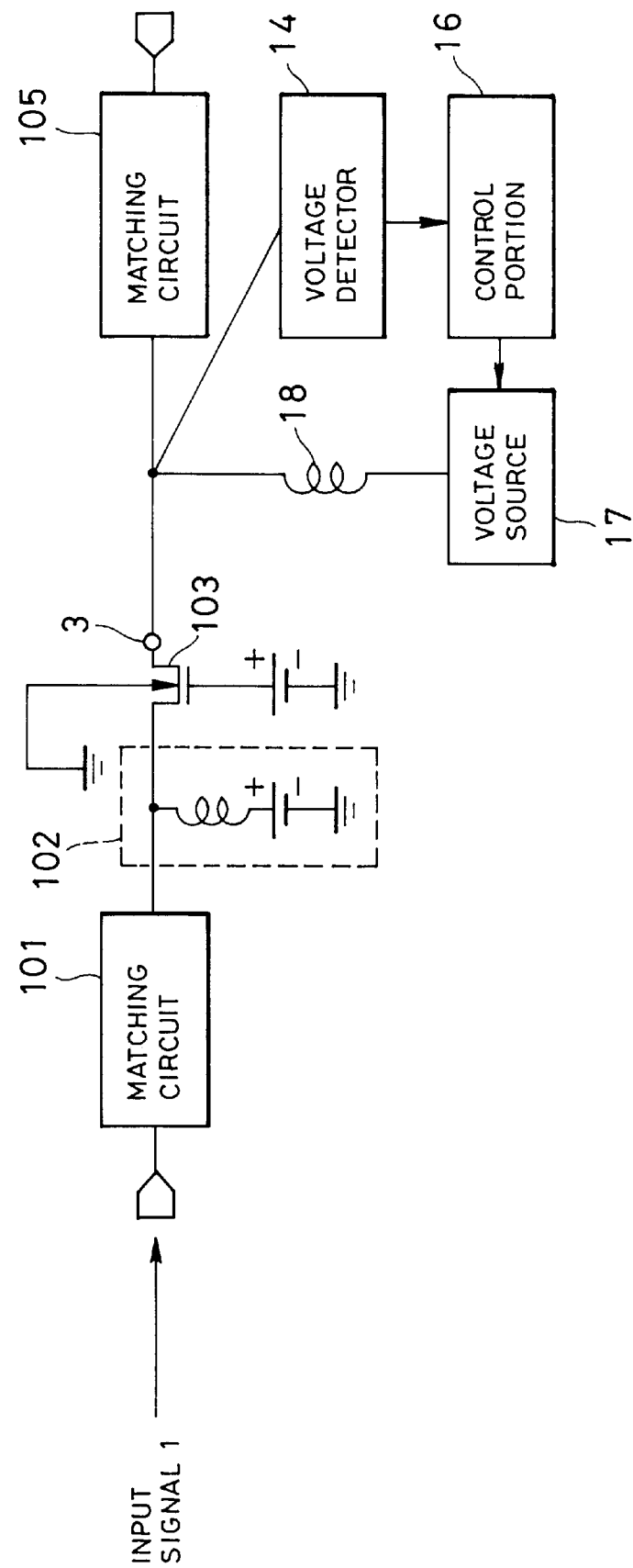
FIG. 14 is a block diagram showing a construction of the fifth embodiment of a high frequency amplifier circuit according to the present invention.

Next, the fifth embodiment of the present invention will be discussed with reference to FIG. 14. FIG. 14 is a block diagram showing the fifth embodiment of a high frequency amplifier circuit according to the present invention. It should be noted that the like portions to those in FIG. 1 will be represented by like reference numerals to avoid necessity of redundant discussion to maintain the disclosure simple enough for facilitating clear understanding of the present invention.

This circuit is constructed with a gate-grounded MOSFET 103 while the MOSFET 103 in FIG. 1 is source-grounded. Other construction is the same as that of FIG. 1.

On the other hand, the operation and effect subsequent to detection of the voltage of the drain terminal is similar to the circuit of FIG. 1. Therefore, discussion will be neglected.

In the present invention, foregoing and later discussed source grounding circuit of the MOSFET 103 can be all modified to gate grounding circuit similar to FIG. 14.

Figure 15:
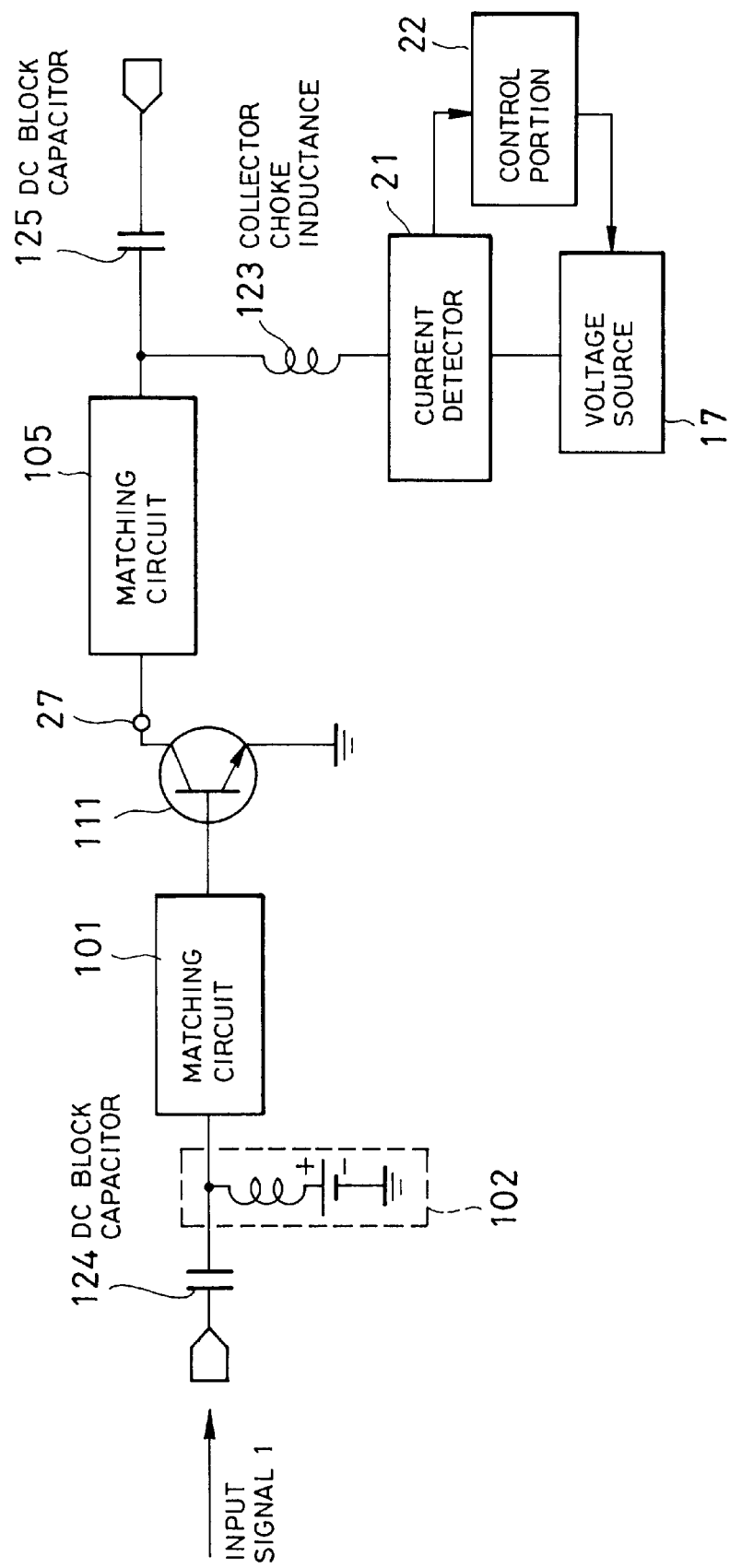
FIG. 15 is a block diagram showing a construction of the sixth embodiment of a high frequency amplifier circuit according to the present invention.

Next, the sixth embodiment of the present invention will be discussed with reference to FIG. 15. FIG. 15 is a block diagram showing a construction of the sixth embodiment of the high frequency amplifier circuit according to the present invention. It should be noted that the like portions to those in FIG. 5 will be represented by like reference numerals to avoid necessity of redundant discussion to maintain the disclosure simple enough for facilitating clear understanding of the present invention.

While the high frequency amplifying active element of FIG. 5 is MOSFET 103, the shown circuit employs the bipolar transistor 111 as the high frequency amplifying active element. Other construction is the same as that shown in FIG. 1 except for the point where DC block capacitors 124 and 125 are added.

On the other hand, operation and effect subsequent to detection of the current of the collector terminal 27 will be neglected for similar to those of the circuit of FIG. 5.

In the present invention, the source grounding circuit of the MOSFET 103 set forth above and later can be all modified with the bipolar transistor 111 similarly to FIG. 15.

Figure 16:
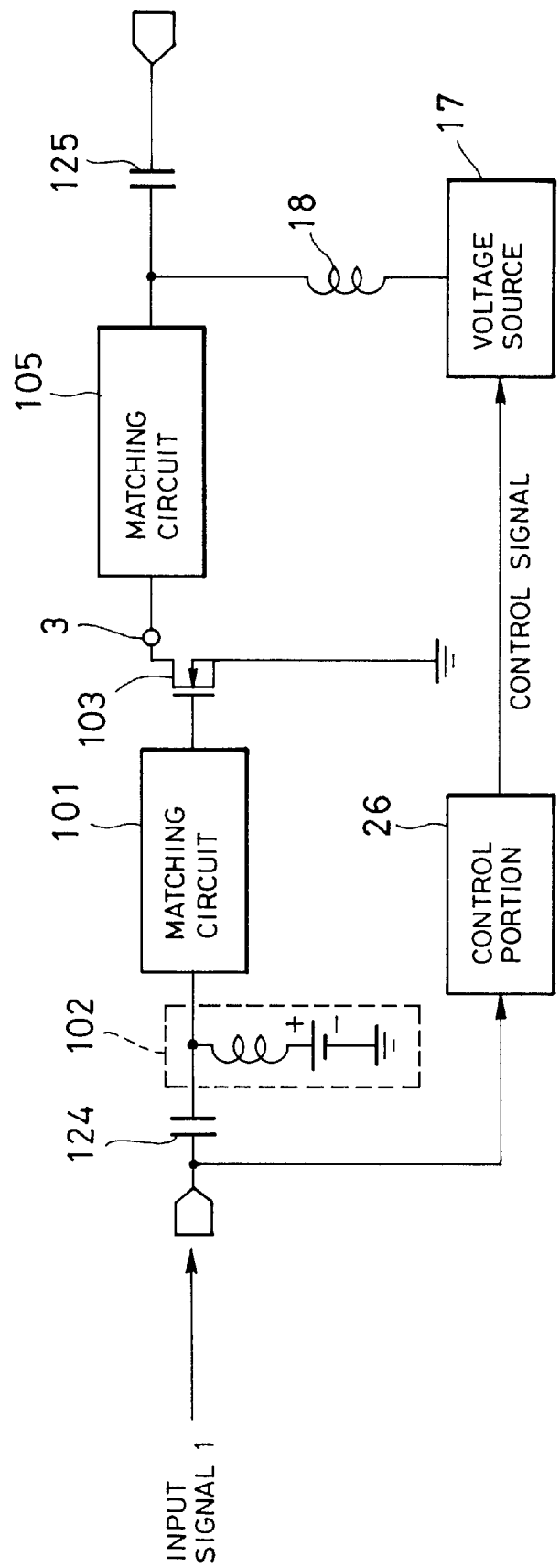
FIG. 16 is a block diagram showing a construction of the seventh embodiment of a high frequency amplifier circuit according to the present invention.

The seventh embodiment of the present invention will be discussed with reference to FIG. 16. FIG. 16 is a block diagram showing the high frequency amplifier circuit according to the present invention. It should be noted that the like portions to those in FIG. 9 will be represented by like reference numerals to avoid necessity of redundant discussion to maintain the disclosure simple enough for facilitating clear understanding of the present invention.

While the high frequency amplifying active element in FIG. 9 is bipolar transistor 111, the shown circuit employs the MOSFET 103 as the high frequency amplifying active element. Other construction is the same as that shown in FIG. 9 except for the point where DC block capacitors 124 and 125 are added.

On the other hand, operation and effect subsequent to inputting of the input signal 1 to the control portion 26 are the same as those shown in FIG. 9, and discussion there of will be neglected.

Figure 17:
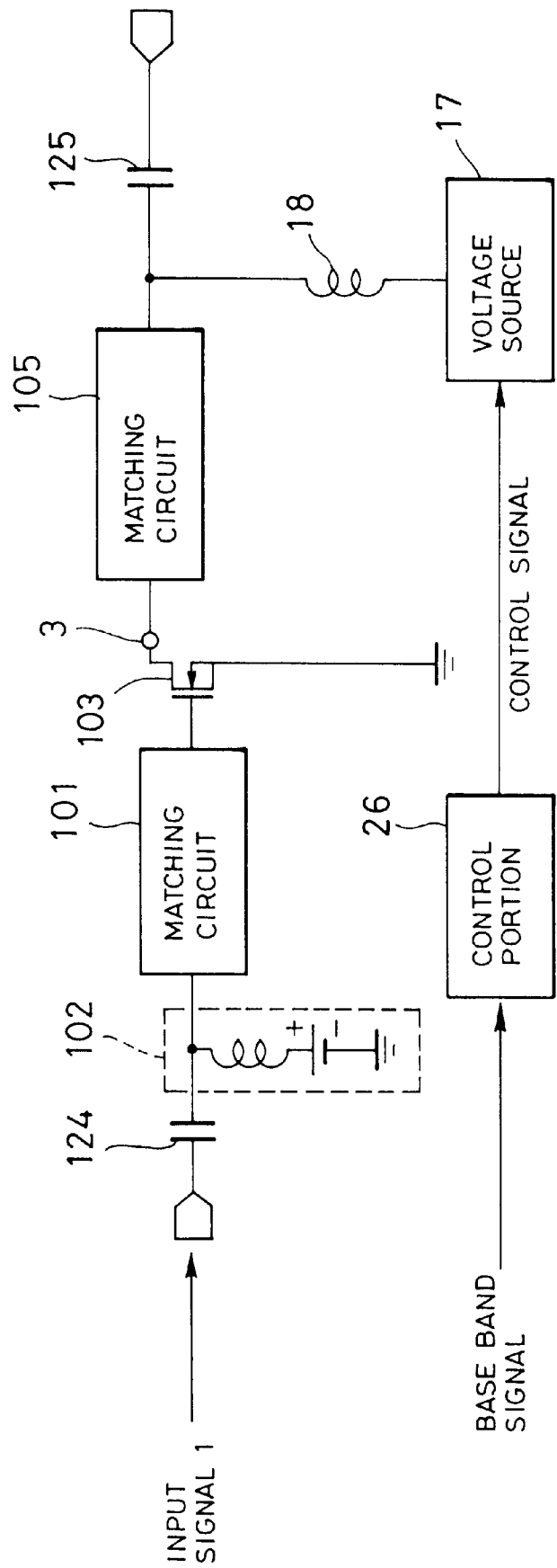
FIG. 17 is a block diagram showing a construction of the eighth embodiment of a high frequency amplifier circuit according to the present invention.

Next, the eighth embodiment of the present invention will be discussed with reference to FIG. 17. FIG. 17 is a block diagram showing the eighth embodiment of the high frequency amplifier circuit according to the present invention. It should be noted that the like portions to those in FIG. 16 will be represented by like reference numerals to avoid necessity of redundant discussion to maintain the disclosure simple enough for facilitating clear understanding of the present invention.

The eighth embodiment is similar in construction, operation and effect to those of the seventh embodiment of FIG. 16 except for the point where a base band signal 131 is input.

Namely, the eighth embodiment predicts the input signal from the base band signal, and predicts the difference frequency voltage from the input signal.

A signal derived by modulating the carrier wave by the base band signal 131 is the input signal 1. For example, in case of the cellular phone, the base band signal is the data derived by digitizing the voice. The carrier is a sine wave of 1.9 GHz. The input signal to the power amplifier is the signal which is modulated with a π/4 shifted QPSK of the carrier by the base band signal. Since modulation system is known, once the string of the bit of the base band signal is known, the input signal 1 can be predicted.

Since distortion characteristics of the amplifier is also known, the difference frequency voltage to be generated at the drain can be predicted from the input signal 1.

Once the difference frequency voltage can be predicted, it becomes possible to predict how the voltage of the voltage source 17 has to be varied. On the basis of the result of prediction, the output of the control portion 26 can be determined.

Figure 18:
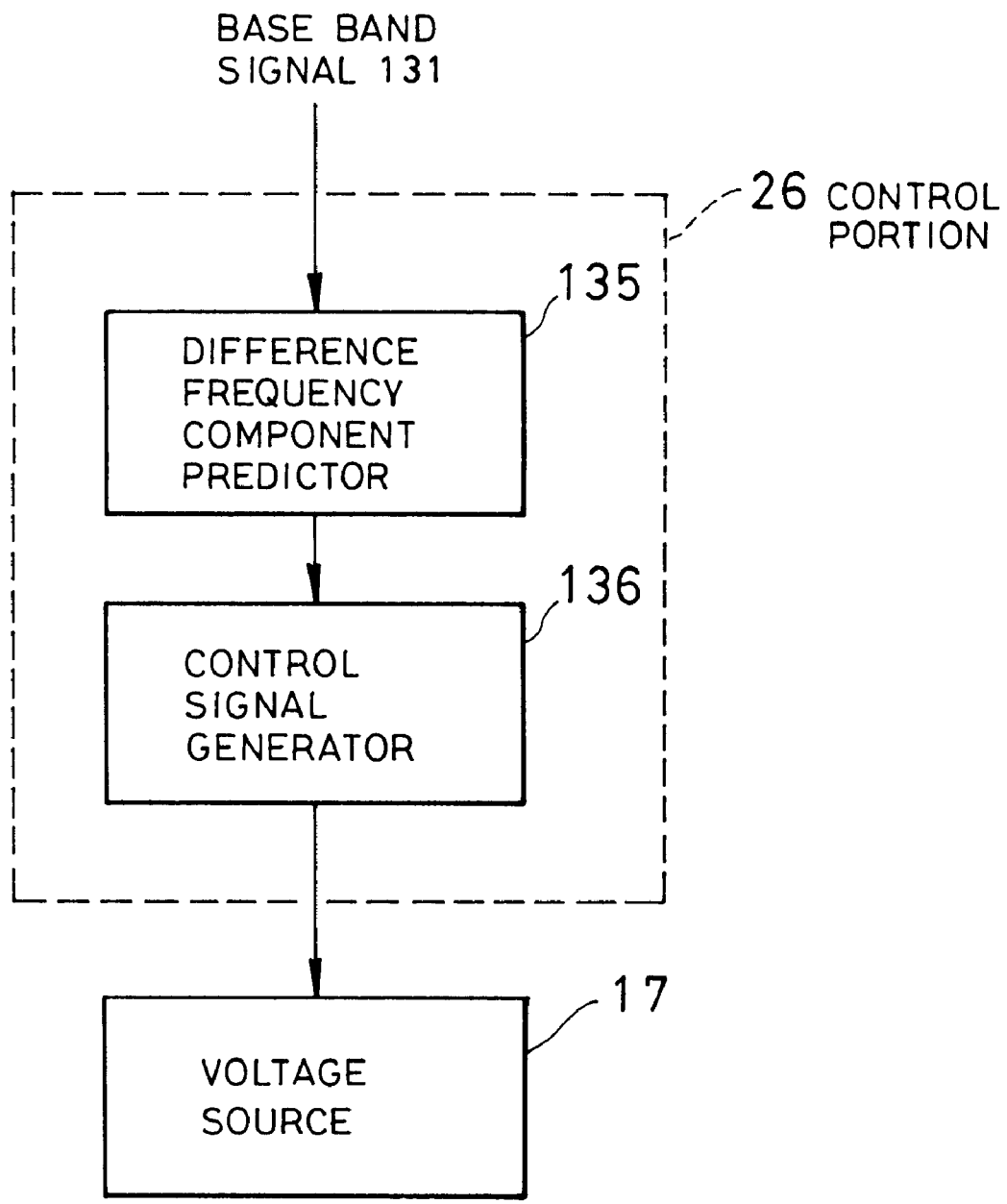
FIG. 18 is a block diagram showing the tenth embodiment of a control portion in the high frequency amplifier circuit according to the invention.

Next, the embodiment of the control portion 26 of the eighth embodiment will be discussed with reference to FIG. 18. FIG. 18 is a block diagram showing the tenth embodiment of the control portion. It should be noted that, for convenience, the voltage source 17 is also illustrated.

At first, the control circuit 26 with reference to FIG. 18 is constructed with a difference frequency component predictor 135 input the base band signal 131 and a control signal generator 136 generating the control signal on the basis of the predicted value.

Next, the operation will be discussed. When the base band signal 131 is input to the difference frequency component predictor 135, the difference frequency component predictor 135 predicts the input signal 1 from the string of the bits of the base band signal 131 to predict the difference frequency component from the predicted input signal 1. The predicted difference frequency component is input to the control signal generator 136. The control signal generator 136 outputs the control signal to the voltage source 17 on the basis of the predicted difference frequency component.

According to the present invention, since the high frequency amplifier circuit including the voltage supply means supplying the power source voltage on the output side of the high frequency amplifying active element is constructed with signal detecting means detecting a difference frequency signal of the input signal at a frequency lower than the input signal of the high frequency amplifier circuit and signal attenuation means for attenuating the difference frequency signal from the output signal by controlling the power source voltage on the basis of the difference frequency signal detected by the signal detecting means. Therefore, by modulating the input signal with the difference frequency component of the input signal, distortion can be reduced.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A high frequency amplifier circuit comprising a voltage supply means for supplying a power source voltage to an output side of a high frequency amplifying active element, said supply means including:

signal detecting means for detecting a difference frequency signal of an input signal at a frequency lower than said input signal of said high frequency amplifier circuit; and signal attenuation means for attenuating said difference frequency signal from an output signal by controlling said power source voltage on the basis of said difference frequency signal detected by said signal detecting means.

2. A high frequency amplifier circuit as set forth in claim 1, wherein said signal detecting means detects a voltage of said difference frequency signal from an output voltage generated on the output side of said high frequency amplifying active element.

3. A high frequency amplifier circuit as set forth in claim 1, wherein said signal detecting means predicts a voltage component of said difference frequency signal generated on the output side from a current flowing through said voltage supply means.

4. A high frequency amplifier circuit as set forth in claim 1, wherein said signal detecting means predicts a difference frequency voltage of said output signal from said input signal.

5. A high frequency amplifier circuit as set forth in claim 1, wherein said signal detecting means comprises resistor for extracting a part of an output current generated on the output side of said high frequency amplifying active element, converting means for converting a current flowing through said resistor means into a voltage and means for extracting only said difference frequency voltage from a voltage after conversion of said converting means, and said signal attenuating means comprises transfer function means for adjusting an intensity and a phase of frequency characteristics of the difference frequency voltage after extraction and converting said difference frequency voltage into a voltage with 180° of phase shift, said transfer function means controlling a power source voltage output from said voltage supply means by a voltage output from said transfer function means.

6. A high frequency amplifier circuit as set forth in claim 1, wherein said input signal is a signal derived by modulating a carrier wave with a base band signal and said signal detecting means predicts said difference frequency voltage of said output signal from a string of high level and low level of said base band signal.

7. A high frequency amplifier circuit as set forth in claim 2, wherein the voltage detected by said signal detecting means is an instantaneous value.

8. A high frequency amplifier circuit as set forth in claim 2, wherein said signal attenuation means controls said voltage supply means for outputting a voltage 180° phase shifted with respect to said difference frequency voltage.

9. A high frequency amplifier circuit as set forth in claim 1, wherein said high frequency amplifying active element is a field effect transistor.

10. A high frequency amplifier circuit as set forth in claim 1, wherein said high frequency amplifying active element is a bipolar transistor.

11. A high frequency amplifier circuit as set forth in claim 1, wherein said signal detecting means comprises a signal detector which detects a voltage of said difference frequency signal but does not detect a voltage of said input signal.

12. A high frequency amplifier circuit as set forth in claim 1, wherein said signal detecting means comprises a low pass filter which passes said difference frequency signal but blocks said input signal, and said voltage detector detects a voltage of said difference frequency signal past through said low pass filter.

13. A high frequency amplifier circuit as set forth in claim 1, wherein a signal output from said signal detecting means is an analog data, said signal attenuation means comprises an AD converter converting said analog data into a digital data, an arithmetic portion performing arithmetic operation of said digital data output from said AD converter, and a DA converter converting a digital data output from said arithmetic portion into an analog signal.

14. A high frequency amplifier circuit as set forth in claim 1, wherein said signal output from said signal detecting means is an analog data, and said signal attenuation means comprises an AD converter converting said analog data into a digital data, and an arithmetic portion performing arithmetic operation of said digital data output from said AD converter.

15. A high frequency amplifier circuit as set forth in claim 1, wherein said output of said signal detecting means is a digital signal, and said signal attenuation means comprises an arithmetic portion performing arithmetic operation of said digital data output from said signal detecting means, and a DA converter converting a digital data output from said arithmetic portion into an analog signal.

16. A high frequency amplifier circuit as set forth in claim 3, wherein a signal output from said signal detecting means is an analog data, said signal attenuation means comprises an AD converter converting said analog data into a digital data, an arithmetic portion performing arithmetic operation of said digital data output from said AD converter, and a DA converter converting a digital data output from said arithmetic portion into an analog signal.

17. A high frequency amplifier circuit as set forth in claim 3, wherein said signal output from said signal detecting means is an analog data, and said signal attenuation means comprises an AD converter converting said analog data into a digital data, and an arithmetic portion performing arithmetic operation of said digital data output from said AD converter.

18. A high frequency amplifier circuit as set forth in claim 3, wherein said output of said signal detecting means is a digital signal, and said signal attenuation means comprises an arithmetic portion performing arithmetic operation of said digital data output from said signal detecting means, and a DA converter converting a digital data output from said arithmetic portion into an analog signal.

19. A high frequency amplifier circuit as set forth in claim 4, wherein said signal detecting means comprises a signal analyzer for analyzing a spectrum of said input signal and a difference frequency component predictor predicting a difference frequency component on the basis of the analyzed spectrum, said signal attenuation means comprises control signal generator generating a control signal on the basis of the difference frequency component predicted by said difference frequency component predictor.

20. A high frequency amplifier circuit as set forth in claim 4, wherein said input signal is a signal derived by modulating a carrier wave with a base band signal, said signal detecting means comprises a down converter lowering said input signal into a base band, an AD converter converting an output from said down converter into a digital data and a difference frequency component predictor predicting a difference frequency component on the basis of the output from said AD converter, and said signal attenuation means comprises control signal generator generating a control signal on the basis of a difference frequency component predicted by said difference frequency component predictor.

21. A high frequency amplifier circuit as set forth in claim 4, wherein said input signal is a signal derived by modulating a carrier wave with a base band signal, said signal detecting means comprises a down converter lowering said input signal into a base band, a spectrum analyzer performing spectrum analysis of said base band output from said down converter, and a difference frequency component predictor predicting a difference frequency component from a spectrum analyzed by said spectrum analyzer, and said signal attenuation means comprises control signal generator generating a control signal on the basis of a difference frequency component predicted by said difference frequency component predictor.

22. A high frequency amplifier circuit as set forth in claim 20, wherein said base band signal is a data derived by digitizing a voice, and said modulation is a QPSK modulation.

23. A difference frequency attenuating circuit for substantially removing a difference frequency signal from an output of a high frequency amplifier, comprising:

a voltage detector coupled to said output of said amplifier for detecting said difference frequency;

a voltage source for supplying a voltage to said output of said amplifier; and a control portion responsive to said voltage detector for controlling said voltage source to substantially remove said difference frequency signal.

* * * * *